United States Patent [19]

Okudaira et al.

[11] Patent Number: 4,705,595

[45] Date of Patent: Nov. 10, 1987

[54] METHOD FOR MICROWAVE PLASMA PROCESSING

[75] Inventors: Sadayuki Okudaira, Ome; Shigeru Nishimatsu, Kokubunji; Keizo Suzuki, Kodaira; Ken Ninomiya, Hachioji; Ryoji Hamazaki, Kudamatsu, all of Japan

[73] Assignee: Hitachi, Ltd., Tokyo, Japan

[21] Appl. No.: 795,314

[22] Filed: Nov. 6, 1985

[30] Foreign Application Priority Data

Nov. 9, 1984 [JP] Japan ................................ 59-234918

[51] Int. Cl.$^4$ ................................................ B44C 1/22
[52] U.S. Cl. .................................... 156/643; 156/345;
156/646; 156/638; 204/192.34
[58] Field of Search ............... 156/345, 643, 646, 638;
204/192 E, 192.34

[56] References Cited

U.S. PATENT DOCUMENTS 4,208,240  6/1980  Latos ............................... 156/643 X
4,581,100  4/1986  Hatzakis et al. ................ 156/345 X Primary Examiner—Arthur Kellogg
Attorney, Agent, or Firm—Antonelli, Terry & Wands

[57] ABSTRACT

Disclosed is a method for microwave plasma processing characterized by providing a plasma processing period of time having no radio-frequency voltage applied to the sample stage. Particularly, if the present invention is used for the shaping by etching of the conductive material layer provided on an underlying insulation material, effects such as shortening of processing time and improvement of etching accuracy can be obtained in the case that the radio-frequency voltage is applied only for the period of time for removing the surface oxide film of the portion to be etched, or in the case that the radio-frequency voltage is further applied until nearly the time to initiate over-etching, and, the latter case is also effective for making the side wall of the portion to be etched vertical.

10 Claims, 3 Drawing Figures

METHOD FOR MICROWAVE PLASMA PROCESSING

BACKGROUND OF THE INVENTION

The present invention relates to a method for microwave plasma processing wherein the method for applying bias to the sample in a plasma processing method such as dry etching and deposition using microwave plasma is improved, particularly to a plasma etching method suitable for increasing etch rate, improving etching accuracy, improving selectivity to the underlying material, removing the surface oxide films of a material to be etched, and/or reducing damage given to the elements in the sample.

It is known that the conventional microwave plasma processing apparatus is provided with means for applying a radio-frequency bias voltage to the sample to be processed in order to improve processing effect, as described, for instance, in the Japanese Patent Publication No. 37311/1981 official gazette. However, the above-mentioned radio-frequency bias voltage is always applied during plasma processing. In etching, for instance, the radio-frequency bias voltage is always applied to the sample during the time etching and over-etching are being carried out, and consideration is not given at all to the resulted reduction of etching selectivity to the underlying material on which a layer of the material to be etched is formed, or to the resulted occurrence of damage of the underlying material and damage accompanying it.

SUMMARY OF THE INVENTION

The object of the present invention is to overcome the above disadvantage of the prior art and provide a method for microwave plasma processing which, in a plasma processing such as etching or deposition in the manufacture of an electronic device, for instance, a semiconductor device, improves selectivity, prevents damage of the elements, improves size controllability of the sample, and/or improves controllability of the processing (corresponding to easiness of automation) without reducing throughput i.e. processing rate.

To achieve the above object, in the plasma processing method which applies a radio-frequency voltage to the sample stage, the method for microwave plasma processing of the present invention applies this radio-frequency voltage only for a selected predetermined period of time within the period of time for plasma processing of the sample. Also in plasma processing, a period for applying no radio-frequency voltage to the sample stage is provided.

Except for a change of the time for applying the radio-frequency bias voltage to the sample, a change of the timing or time for applying the radio-frequency voltage to the sample stage, the conventional method for microwave plasma processing may be used. The conventional method for microwave plasma processing forms a discharge space by introducing a microwave into a vacuum chamber into which depressurized discharge gases have been introduced, thus changing the discharge gases to plasma. Simultaneously a radio-frequency voltage is applied to a sample stage provided in the above-mentioned vacuum chamber for holding the sample to be processed by plasma, thereby the sample is etched and/or deposited by plasma.

As the above discharge gases, gases suitable for etching or suitable for deposition are used.

The present invention is applied to a sample having an electrically conductive material layer provided on an underlying insulation material such as oxide or nitride so as to etch the conductive material into a desired shape, by which, for example, wiring patterns can be formed on a substrate. In this case, by applying a radio-frequency voltage to the sample stage for a period of time from the initiation of plasma processing until the surface oxide film or a portion to be etched is removed, the time required to remove the surface oxide film can be remarkably shortened. In addition, if the radio-frequency voltage is applied until just before removing of the portion to be etched is completed (i.e. just etching time), an effect that the side wall of the etched portion becomes closer to vertical can be obtained. If the above-radio frequency voltage is applied until midway through the step of removing the portion to be etched, it is also effective for making the side wall closer to vertical, but, the effect is inferior as compared with that of the case that the radio-frequency voltage is applied until just etching time.

After the portion to be etched is removed, overetching is further performed for a predetermined time, usually, without applying the radio-frequency voltage. However, so long as the underlying insulation layer of a desired film thickness remains, the above-mentioned radio-frequency voltage may be applied even after the portion to be etched is removed. The time for this is remarkably short as compared with the whole of over-etching time. After application of the above-mentioned radio-frequency voltage to the sample stage is stopped, the sample stage is provided with a ground potential or floating potential.

In processing techniques utilizing microwave plasma such as etching and deposition, the sample is usually provided with a ground potential or floating potential, and it has been found that applying a bias voltage to the sample has no particular effect on microwave discharge. Accordingly, the control technique of microwave plasma processing of the present invention using an independently variable bias applying method for applying a bias only for a necessary time period in the etching time period becomes very effective in the manufacture of semiconductor devices.

DESCRIPTION OF THE PREFERRED EMBODIMENTS

Figure 1:
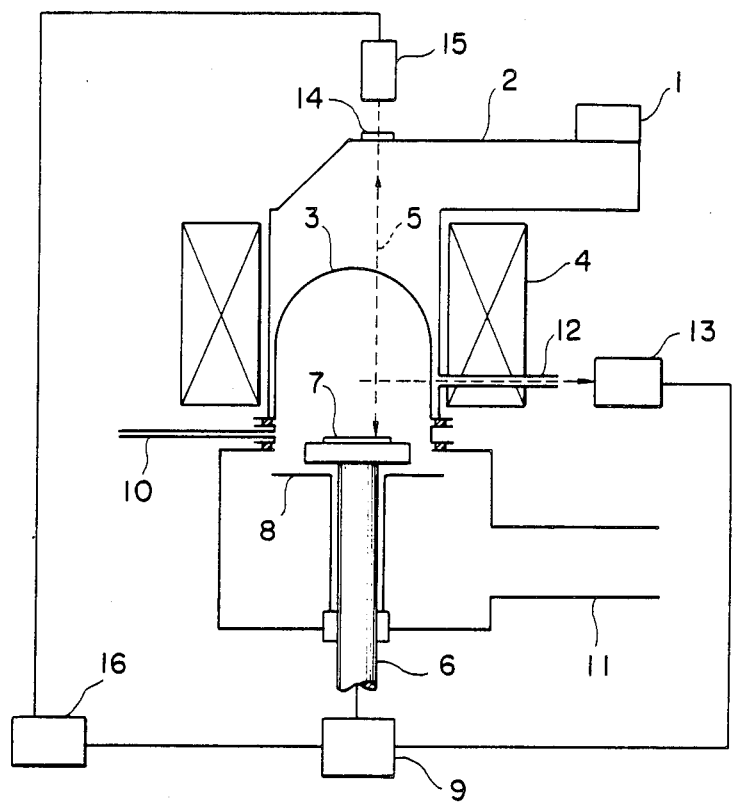
FIG. 1 is a schematic diagram of the microwave plasma processing apparatus having magnetic field which is used in an embodiment of the present invention.

FIG. 1 is a schematic diagram showing the microwave plasma processing apparatus having a magnetic field which is used in this embodiment. The main portions of the apparatus as shown in FIG. 1 are a microwave generator 1, a waveguide 2, a microwave transmittable vacuum chamber 3, a magnetic field generating coil 4, a sample stage 6, a sample 7, a fixed voltage applying electrode 8, a radio-frequency applying power supply 9, a discharge gas introducing pipe 10, an exhaust port 11, an optical window for monitoring emission spectrum 12, an emission spectrum data processing apparatus 13, a laser beam entrance and exit window 14, a laser oscillator and laser beam detector 15, and a laser intensity data processing apparatus 16. Symbol 5 in the figure designates a laser beam. The emission spectrum data processing apparatus 13 is a data processing apparatus mainly comprising a spectrophotometer.

The vacuum chamber 3 is previously evacuated, and gases suitable for etching or deposition are introduced thereinto in a depressurized state and are excited by microwaves. The magnetic field generating coil 4 provides a magnetic field from the outside in order to improve the plasma generating efficiency, and the Electron Cyclotron Resonance (ECR) stage can also be created by microwave electric field and magnetic field. Further, since discharge sometimes occurs easily without a magnetic field when the gas pressure is higher, the magnetic field generating coil is not always needed. The sample 7 to be processed is placed on the sample stage 6 positioned in the vicinity of plasma, and the sample stage 6 is electrically insulated from the chamber wall so that it can be applied with any voltage. Especially, even if any insulation material exists in the surface and/or the reverse side of the sample 7, it is possible to apply the radio-frequency bias voltage to the sample surface.

Proceeding of etching or deposition due to the reaction between reactive species and the sample can be observed by monitoring of the film thickness. Monitoring of the film thickness can be performed by measuring reflected diffraction intensity of the laser beam applied when the film is transparent, or it can also be performed by measuring presence of the interference color appearing in the reflected light of the laser beam from the sample surface when the film changes from opaque to semitransparent or from semitransparent to opaque according to the change in the film thickness due to proceeding of the process. In this embodiment, by using the laser oscillator and laser beam detector 15 and the laser intensity data processing apparatus 16, as known well, the film thickness could be measured. For entrance and exit of the laser beam, the optical window 14 consisting of an opening provided in a portion of the waveguide 2 is used.

In etching, without monitoring the film thickness as described above, the data as shown in FIGS. 2a and 2b can be obtained by observing emission spectrum intensity of particular wave lengths in plasma, and the proceeding state of etching can be known. For such optical emission monitoring, an optical window provided in a portion of the waveguide or vacuum chamber may be used. This embodiment includes the optical window for monitoring emission spectrum 12 consisting of an opening provided in a portion of the magnetic field generating coil 4 and the waveguide. For spectrum monitoring, the emission spectrum data processing apparatus 13 is used.

Description is hereinafter provided for etching processing in the embodiment, and since a similar apparatus can also be applied for deposition processing, explanation is omitted for deposition. In etching by plasma, it is known that "ions" in plasma and "radicals which are neutral particles, but also are reactive species" usually react with the sample. However, if the sample is covered with an oxide film, contribution of ions is required because etching reaction is very slow if only neutral radical species are used.

In the case that a conductive material layer provided on a substrate is formed into a predetermined shape so as to form wiring pattern, ordinary wiring materials, for instance, conductive materials such as polycrystalline Si, Al, Al alloy, Mo, W, Mo silicide and W silicide have a thin oxide film formed on the surface thereof under the atmospheric pressure, and etching of the wiring material is often delayed by existence of this surface oxide film. Namely, the above wiring materials are rapidly etched by neutral radicals such as F or Cl atoms, but the oxide is etched at a very small rate if only neutral radicals are used. To get high selectivity to the underlying material (usually, oxide or nitride, and particularly, silicon oxide or silicon nitride in most cases) by utilizing this characteristic, the wiring material has generally been etched heretofore under the condition that the quantity of neutral radicals is greater than that of ions. Thus, the surface oxide film obstructs etch rate. As gases suitable for the above etching, for instance, $SF_6$, $CF_4$, $CCl_4$, $Cl_2$, $C_2F_3Cl_3$, $C_2F_2Cl_4$, $C_2FCl_5$ and $CFCl_3$ can be used, but it is not necessarily limited to these, and gases generally used for microwave plasma etching may also be used in the present invention.

In this embodiment, in order that the etching time does not become longer even in the case that the material to be etched has a surface oxide film as described above, a desired voltage is provided from the radio-frequency power supply 9 to the sample stage 6 made of conductor simultaneously with initiation of discharge so as to increase the flux and energy of ions incident upon the sample, thereby to improve the etch rate of the surface oxide film. On this occasion, microwave plasma is only slightly of changed in its plasma state by applying of the radio-frequency power. However, the fixed voltage applying electrode 8 is preferably placed near the sample to enhance the effect of applying the radio-frequency voltage. The voltage may usually be provided as ground potential, but, especially, in the order to concentrate the electrons in plasma upon the above-mentioned electrode effectively, it is sometimes provided as a positive potential of about 100 V or less.

In addition, it is desirable that the radio-frequency voltage to be applied is usually about 100 V or greater (peak-to-peak voltage, hereinafter similarly applied for radio-frequency voltage), but it is desirably about 200 V or greater if the material to be etched is Al. An effect of bias is recognized if the frequency of the radio-frequency voltage to be applied is in the range of 10 KHz–15 MHz, but the frequency is preferably higher than 100 KHz, particularly 800 KHz or 13.56 MHz in most cases. The fixed voltage applying electrode 8 may be provided in any place near the sample in the vacuum chamber 3, and it need not particularly be limited in shape, but it needs to be insulated from the sample stage 6. Further, if a housing portion such as exhaust port 11 is constructed by a conductor such as metal, the fixed voltage applying electrode can be omitted by providing ground potential to the above portion.

Figure 2A:
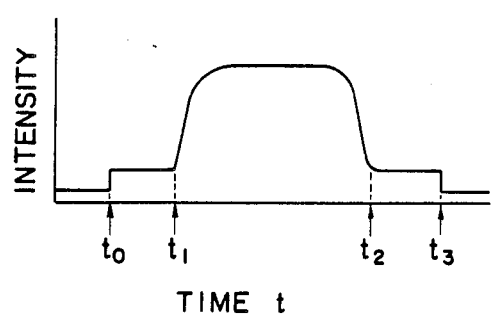
FIG. 2a is a graph showing the relation between emission spectrum intensity and time in the case that no radio-frequency bias voltage is applied in microwave plasma etching.
Figure 2B:
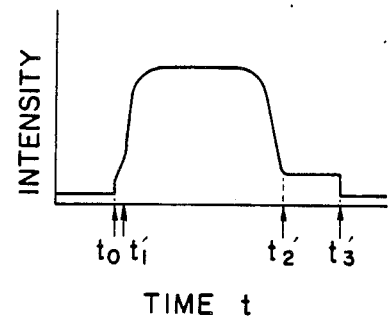
FIG. 2b is a graph showing the relation between emission spectrum intensity and time in the case that a radio-frequency bias voltage is applied in microwave plasma etching until the surface oxide film of the portion to be etched is removed.

After the surface oxide film is removed as described above, application of the radio-frequency bias voltage to the sample is stopped, and the potential of the sample stage 6 is set to a ground potential or floating potential. The timing for this is found by seeing the etching monitor. FIG. 2a shows change in the emission spectrum intensity according to time in the etching monitor, and $t_0$, $t_1$, $t_2$ and $t_3$ designates the times to initiate discharge, to initiate etching of the material to be etched, to complete etching, and to stop discharge, respectively. The period between $t_0$ and $t_1$ means the time during which the surface oxide film and the like are being removed, and the period between $t_1$ and $t_2$ designates the time during which etching is being carried out. For instance, if 800 KHz radio-frequency power (the voltage is 200 V for Al, and 100 V for others) is applied in the initial period (between $t_0$ and $t_1$) for the same sample as in the case of FIG. 2a (in this case, substantially the same monitoring curve is obtained for polycrystalline Si, W, Mo, silicide and Al), a result as shown in FIG. 2b is obtained. It is seen that the period from $t_0$ to $t'_1$ became very short. In FIG. 2b, $t'_1$, $t'_2$ and $t'_3$ correspond to $t_1$, $t_2$ and $t_3$ in FIG. 2a, respectively.

The difference in the etching methods in the cases of FIG. 2a and FIG. 2b is effective also for improving etching accuracy. That is, usually, when etching is carried out, over-etching is invariably performed after etching is completed. Over-etching time is usually decided in certain ratio to etching time. In an automated apparatus, etching time is $t_2 - t_0$ in FIG. 2a and $t_2' - t_0$ ($=t_2' - t_1'$) in FIG. 2b, and if over-etching rate for these is assumed to be $\alpha$, the over-etching times are as follows for FIG. 2a and FIG. 2b, respectively.

$$t_3 - t_2 = \alpha(t_2 - t_0) = \alpha(t_2 - t_1) + \alpha(t_1 - t_0)$$

$$t_3' - t_2' = \alpha(t_2' - t_1') \approx \alpha(t_2 - t_1)$$

That is, in the case of FIG. 2a that no radio-frequency voltage is applied, over-etching time becomes longer by $\alpha(t_1 - t_0)$. This time does not become steady because it fluctuates according to a pre-treatment of sample and to the time in which the sample has been left in the air. If over-etching time fluctuates, side etch (pattern width decreasing) proceeding during over-etching will differ, and this causes fluctuations of the etching pattern width, which can greatly reduce the element performance. On the other hand, in the case of FIG. 2b that the radio-frequency voltage is applied, over-etching time becomes steady thereby to provide uniform pattern width of good performance. Incidentally, the units of the ordinate and abscissa axes in FIGS. 2a and 2b are arbitrary.

Next, if the radio-frequency power is continuously applied from $t_0$ to $t_3$, the etching time ($t_2 - t_1$) can be somewhat shortened. However, the etch rate of the underlying material (oxide film, nitride film) during the the over-etching time (between $t_2$ and $t_3$) increases rapidly, and, accordingly, selectively is remarkably reduced or the elements are damaged by high energy particles incident upon the underlying base. Thus, it is not desirable that the radio-frequency voltage is applied till $t_3$. However, if the radio-frequency voltage is applied during etching ($t_2 - t_1$) differently from the cases of FIG. 2a and FIG. 2b, the side wall of the portion to be etched strongly tends to become vertical, and, thus, if vertical etch is required, reduction of selectivity and damage of the elements can be prevented by applying the radio-frequency voltage from $t_0$ to $t_2$ and stopping application of the radio-frequency voltage at $t_2$ or just before $t_2$. If the radio-frequency voltage is applied until certain time between $t_1$ and $t_2$, even though it is not applied until $t_2$ or until just before $t_2$, an effect to that extent can be obtained, but it is most suitable for obtaining a vertical etching profile if the radio-frequency voltage is applied until $t_2$ or until just before $t_2$. In addition, the radio-frequency voltage may also be applied, even after initiation of over-etching, until a time within the range in which the underlying insulation film of desired thickness still remains. The over-etching period for applying the radio-frequency voltage can be easily decided by experiment, and, the underlying insulation film can remain in the decided over etching period.

To perform the above-mentioned radio-frequency voltage control, finding the point time to stop applying of the radio-frequency voltage by using the etching monitor method becomes an important technique. When the radio-frequency voltage is applied only during the time for removing the surface oxide film, it can be easily detected by the change in emission spectrum intensity according to time as shown in FIG. 2a or 2b, and ON/OFF of the radio-frequency power supply can be controlled by the signal detected by the emission spectrum data processing apparatus 13. When the radio-frequency voltage is applied until just before the etching stop point $t_2$ or $t'_2$, the beginning the fall of the emission spectrum curve just before $t_2$ or $t'_2$ must be detected, which can cause some error. Accordingly, direct detection of the thickness of the remaining film to be etched is effective. For that purpose, the well-known thickness measurement by quantitative interpretation of interference using laser beam is effective for optical transmittable material such as polycrystalline Si, and, in the case of non-transmittable material such as W, Mo and Al, since it becomes semitransparent and the interference color appears at the point of time it becomes a very thin film, detection of this color is effective.

As described above, in the microwave plasma etching method, since the radio-frequency voltage can be controlled independently without changing the plasma state, improvement of processing accuracy and shortening of etching time can be achieved while maintaining, as before, high selectivity to the underlying materials and the characteristic that damage to the elements is reduced. Further, in microwave plasma, deposition can be performed only by changing discharge gases, and, since flattening of the deposite film is made possible without reducing deposition rate by applying the radio-frequency voltage during deposition, independent control of the radio-frequency voltage is effective.

A specific embodiment is described below.

A polycrystalline Si layer of 350 nm thickness was formed on a 20 nm-thick $SiO_2$ layer (hereinafter referred to as underlying $SiO_2$ layer) which was formed on a silicon wafer, and this polycrystalline Si layer was etched into a predetermined shape in the way as described above by using the microwave plasma processing apparatus shown in FIG. 1, thereby to form a wiring pattern. Mixed gases of $SF_6$ and $CCl_4$ in the volume ratio 1:1 were used as the gases to be introduced, and the radio-frequency voltage to be applied to the sample stage was 200 V (peak-to-peak voltage) and the frequency was 800 KHz. In the case that the surface oxide film of the polycrystalline Si is thicker, if the radio-frequency voltage was not applied, the time from initiation of discharge to completion of etching ($t_2 - t_0$ in FIG. 2a) is about 30 seconds, abot 10 seconds of which are the time for removing the surface oxide film ($t_1 - t_0$ in FIG. 2a). When the radio-frequency voltage was applied only at the time of removing the surface oxide film during monitoring of the emission spectrum of SiF, the surface oxide film was removed within about one second and etching time could be shortened by about 30%.

In addition, when W was used instead of the above polycrystalline Si, a substantially similar result was obtained. In this case, the time to stop applying the radio-frequency voltage could be found by monitoring the emission spectrum of W.

Further, when the radio-frequency voltage was applied to the sample stage until just before over-etching, it was confirmed that the side wall of the etched portion became closer to vertical.

Over-etching was carried out for about 20 seconds without applying the radio-frequency voltage. In this case, undercut caused by over-etching could be restricted to 0.1 $\mu$m or less. In addition, reduction of the film thickness of the underlying $SiO_2$ layer was 5 nm or less. Therefore, the underlying $SiO_2$ layer has remaining thickness of 15 nm or more, and it can thus be used without a bad influence, for instance, on the gate oxide film of MOS transistor. In contrast to this, when the radio-frequency voltage was also continuously applied during over-etching as in the prior art, the underlying $SiO_2$ layer was almost lost by 20-second over-etching. When the thickness of the underlying $SiO_2$ layer before etching was made to be about 50 nm and the same experiment was carried out, the thickness of the underlying $SiO_2$ layer decreased by about 30 nm.

According to the present invention, not only the removing time of the surface oxide film of the sample to be processed can be shortened, but also influence by over-processing can be reduced, and this is effective for improving throughput and accuracy in the manufacture of semiconductors.

In addition, stopping the application the above radio-frequency voltage can be performed by viewing the monitoring data to determine the timing therefor and manually turning off the radio-frequency power supply, and it is also apparent that this process is automated very easily.

Incidentally, in the method for microwave plasma processing of the present invention conventional knowledge and known teachings may be adopted in connection with matters not specifically described in the instant specification.

What is claimed is:

1. A method for microwave plasma processing of a sample, having an electrically conductive material layer provided on a substrate, said electrically conductive material layer being made of at least one material selected from the group consisting of silicon, metal and silicide, the method comprising the steps of:
   forming a discharge space by introducing a microwave into a vacuum chamber into which discharge gases, suitable for etching have been introduced, to thereby change said discharge gases to plasma; and
   applying a radio-frequency voltage to a sample stage provided in said vacuum chamber for holding said sample to be processed by etching said plasma; wherein said step of applying said radio-frequency voltage includes applying said radio-frequency voltage only for a period of time from initiation of plasma processing of said sample until a surface oxide film of the portion of said electrically conductive material layer to be etched is removed.

2. A method for microwave plasma processing according to claim 1 characterized in that said sample is constructed by providing said electrically conductive material layer on an underlying oxide or nitride.

3. A method for microwave plasma processing according to claim 1 characterized by determining the time when removing of the surface oxide film of said portion to be etched is completed by monitoring an emission spectrum in said discharge space.

4. A method for microwave plasma processing according to claim 1 characterized by carrying out plasma processing with said sample stage being maintained at a ground potential or floating potential after application of said radio-frequency voltage is stopped.

5. A method for microwave plasma processing according to claim 1 characterized in that said conductive material layer is made of at least one material selected from the group consisting of polycrystalline silicon, aluminum, aluminum alloy, molybdenum, tungsten, molybdenum silicide and tungsten silicide.

6. A method for microwave plasma processing of a sample, having an electrically conductive material layer provided on a substrate, said conductive material layer being made of at least one material selected from the group consisting of silicon, metal and silicide, comprising the steps of:
   forming a discharge space by introducing a microwave into a vacuum chamber into which discharge gases, suitable for etching have been introduced, thereby to change said discharge gases to plasma, said discharge gases comprising at least one gas selected from the group consisting of $SF_6$, $CF_4$, $CCl_4$, $Cl_2$, $C_2F_3Cl_3$, $C_2F_2Cl_4$, $C_2FCl_5$ and $CFCl_3$, and
   applying a radio-frequency voltage to a sample stage provided in said vacuum chamber for holding a sample to be processed by etching by plasma, said radio-frequency voltage being in the range of 100 volts and 200 volts;
   wherein said step of applying said radio-frequency voltage includes applying said radio-frequency voltage only for a period of time from initiation of plasma processing of said sample until a surface oxide film of the portion of said conductive material layer to be etched is removed, said radio-frequency voltage having a frequency in the range of 10 KHz–15 MHz, and preferably being equal to 800 KHz or 13.56 MHz.

7. A method for microwave plasma processing according to claim 6, wherein said sample is constructed by providing said electrically conductive material layer on an underlying oxide or nitride.

8. A method for microwave plasma processing according to claim 6, further comprising the step of determining the time when removing of the surface oxide film of said portion to be etched is completed, by monitoring an emission spectrum in said discharge space.

9. A method for microwave plasma processing according to claim 6, further comprising the step of carrying out plasma processing with said sample stage being maintained at a ground potential or floating potential after application of said radio-frequency voltage is stopped.

10. A method for microwave plasma processing according to claim 6, wherein said conductive material layer is made of at least one material selected from the group consisting of polycrystalline silicon, aluminum, aluminum alloy, molybdenum, tungsten, molybdenum silicide and tungsten silicide.

* * * * *